United States Patent [19]

Novembre

[11] Patent Number: 5,451,480
[45] Date of Patent: Sep. 19, 1995

[54] ARTICAL FABRICATION UTILIZING LITHOGRAPHIC PROCESSES

[75] Inventor: Anthony E. Novembre, Union, N.J.

[73] Assignee: AT&T Corp., Murray Hill, N.J.

[21] Appl. No.: 289,982

[22] Filed: Aug. 12, 1994

Related U.S. Application Data

[63] Continuation of Ser. No. 69,665, Jun. 1, 1993, abandoned, which is a continuation of Ser. No. 873,532, Apr. 21, 1992, abandoned, which is a continuation of Ser. No. 484,707, Feb. 26, 1990, abandoned.

[51] Int. Cl.⁶ .............................................. G03F 7/26
[52] U.S. Cl. .................................... 430/30; 430/296; 430/311; 430/320; 356/355
[58] Field of Search ................. 430/30, 296, 320, 329, 430/311; 356/355

[56] References Cited

U.S. PATENT DOCUMENTS

| | | | |
|---|---|---|---|
| 3,708,229 | 1/1973 | Pircher | 356/355 |
| 4,647,172 | 3/1987 | Batchelder | 430/30 |
| 4,851,311 | 7/1989 | Millis et al. | 430/30 |

OTHER PUBLICATIONS

Novembre et al. SPIE vol. 1087 Integrated Circuit Metrology, Inspection, and process Control III (1989) pp. 460–468 "An In Situ Interferometric Analysis of Resist Development on Photomask Substrates".

"Optimized Endpoint Exposure for Photoresist Development" (27443) Research Disclosure, Feb. 1987, Number 274.

Ed. L. F. Thompson, C. W. Wilson, M. J. Bowden, ACS Symposium Series 219, American Chemical Society, Washington, D.C. 1983, p. 204.

*Primary Examiner*—Kathleen Duda
*Attorney, Agent, or Firm*—Bruce S. Schneider

[57] ABSTRACT

A procedure for producing an article such as an integrated circuit or a lithographic mask including the step of exposing and developing a resist material during a lithographic process is substantially improved by utilizing a specific technique. In particular, a prototypical plot is made based on typical conditions. Thereafter, this calibration is employable for developing the resist material even at substantially different environmental and processing conditions.

5 Claims, 1 Drawing Sheet

ARTICAL FABRICATION UTILIZING LITHOGRAPHIC PROCESSES

This application is a continuation of application Ser. No. 08/069665, filed on 6/1/93 now abandon, which is a continuation of Ser. No. 07/873532, filed on 4/21/92 (now abandoned), which is a continuation of Ser. No. 07/484707, filed on 2/26/90 (now abandoned).

BACKGROUND OF THE INVENTION

1. Field of the Invention

This invention relates to articles made by lithographic processes and in particular to processes made utilizing a lithographic material that requires wet development.

2. Art of the Invention

A variety of articles such as lithographic masks or integrated circuits are manufactured by a series of steps including a lithographic processing step. In such lithographic processing stops a radiation sensitive material generally denominated a resist is exposed to actinic radiation in a desired pattern. The radiation in a positive resist induces a chemical reaction in the impacted area and produces a higher solubility in exposed regions relative to unexposed regions. During development, this differential solubility is then utilized to remove the exposed regions by immersion in or spraying with a suitable solvent.

The development of the exposed resist material must be performed under conditions that ensures that the regions to be removed are indeed essentially totally removed. Thus, generally an overdevelopment is performed. This overdevelopment i.e., development for a time longer than that required to totally clear at least a portion of the exposed region, ensures that all regions to be removed are cleared. (Features in different geometric surrounding generally develop at different rates and thus necessitate such overdevelopment.) The rate of development is strongly dependent for many resists such as poly 1-butene sulfone (PBS) on environmental conditions such as relative humidity as well as on the actual processing conditions. Therefore, generally resist development is performed in a controlled environment to improve reproducibility. Such controlled environments typically involve a controlled environmental chamber surrounding the development apparatus that in turn requires a large capital investment, as well as associated maintenance and operating costs.

Despite the presence of a controlled environment, resists are generally not developed for a pre-established period of time. Typically, development is performed, the resist material is inspected to see if all exposed dimensions have reached their desired size, and the development and inspection procedure is iterated until this size is reached. This labor-intensive processing together with the previously discussed capital investment and costs is obviously not entirely desirable. Additionally, the necessitated increased handling tends to introduce contamination into the process thereby increasing lithographic defects with a concomitant decrease in product yield.

Therefore, any procedure including a lithographic processing step for producing an article would significantly benefit from the successful elimination of a controlled environment and substantial operator handling e.g., iterative processing.

SUMMARY OF THE INVENTION

Essentially complete automation together with the elimination of a controlled environment is achieved by utilizing an optically controlled development procedure that employs a development time determined from prototypical samples. In this procedure, a series of prototypical samples are prepared employing the exposure dose, developer, and resist material ultimately to be used. For the prototypical samples, the remaining conditions such as relative humidity, and processing conditions such as developer concentration, temperature, resist chemical composition (e.g., molecular weight) and substrate type need only be chosen such that the desired pattern having suitable dimensions is achievable. This series of samples, for an exposure designed to yield a given critical feature size, yields a plot of actual feature dimension obtained versus development time (the prototype plot). (Critical feature size is the size of the feature most effecting the properties of the article e.g., mask or integrated circuit operation.) Once the prototype plot is obtained, it is utilized in the production of the desired article by using the development time (preferably in times of percentage overdevelopment) determined from the prototypical plot for the critical feature dimension desired after development. By this expedient desired feature size is obtained without iterative, operator-intensive processing and without concern for environmental or processing condition fluctuations. This technique is also advantageously used for processes employing negative resists, i.e. resists where the unexposed regions are removed, provided such resists undergo a change solubility by mechanisms leading to linewidth changes with development time.

BRIEF DESCRIPTION OF THE FIGURE

The figures are illustrative of the results achieved utilizing the invention.

DETAILED DESCRIPTION

As discussed, by utilizing a prototype plot, it is possible to reproducibly fabricate articles in a procedure utilizing a lithographic step without meticulously controlling environmental and processing conditions and without significant operator intervention. This prototype plot is generally obtained by performing a series of controlled samples. In these controlled samples, the development process is monitored utilizing for example an optical technique.

Figure 1:
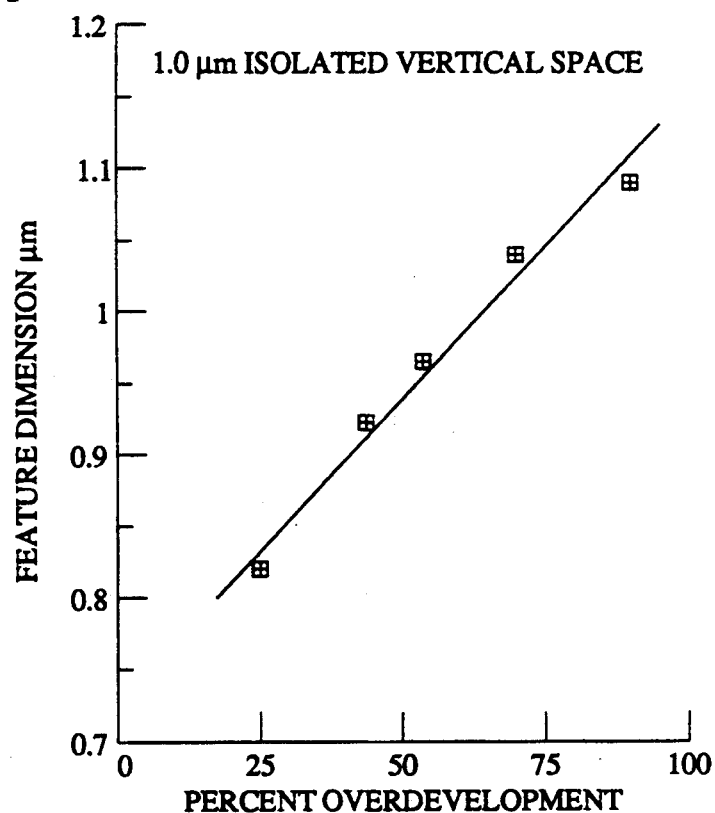

Exemplary of such techniques are those involving interference measurements. For example, a region of the resist material specifically dedicated to such monitoring and which is exposed together with the pattern exposure is monitored during development by interferometry. (Interferometry is a conventional monitoring technique described in Principles of Optics M. Burn and E. Wolf 6th ed. Pergamen Press, NYC[1980]). Through this interferometric monitoring, the change during development in thickness of the exposed regions of the resist versus time is obtained. The resulting curve exhibits a series of extrema. The penultimate extrema (as is easily calculated from the thickness of the deposited resist, the refractive index of the resist, and the wavelength employed in the interferometric process) is identified and used as the time reference point. For each sample used in producing the prototype plot, a specific overdevelopment time is used. (This overdevelopment time is conveniently expressed as a time period that is a percentage of the time required to reach the time reference point.) Each sample employed is performed with a different percentage overdevelopment time with these percentage overdevelopment times being chosen to span a relatively wide time range e.g., between 0 and 150 percent overdevelopment. For each sample, the obtained feature dimension as measured by e.g., scanning electron microscopy is recorded. From these samples a plot is then made of percentage overdevelopment versus the feature dimension obtained. (A typical plot is shown in FIG. 1.) Once this plot is made, it is desirable to employ a curve-fitting routine to obtain a smooth curve corresponding to the obtained data.

The resulting prototype plot is used in a lithographic procedure included in the actual article fabrication process. As previously discussed, the prototype plot is accurately indicative of the necessary processing times irrespective of environmental and processing conditions provided the prototype plot data was obtained by using the same dose as employed in the article fabrication process. That is, a single prototype plot relating feature dimension obtained versus overdevelopment times for a given feature dimension is valid over all environmental and processing conditions even though the plot was determined using only one set of such conditions.

In operation during the lithographic step of the article fabrication process, the change in resist thickness is monitored by employing the same monitoring procedure e.g., interferometric procedure, as used in the determination of the prototype plot. The percentage overdevelopment employed is that obtained from the prototype plot for the feature dimension required after development is completed. (The definition of percentage overdevelopment is the same as that used in the determination of the prototype plot.) Thus for example, in FIG. 1, if an isolated feature dimension of 1.0 μm is desired an overdevelopment of approximately 66% is used. Clearly, some error is acceptable in the level of overdevelopment employed and generally variations beyond that determined from the plot of greater than 5% typically is not desirable.

The prototype plot employed is based on the critical feature to be produced in the article. If more than one critical feature is present, then it is typically desirable to determine two prototype plots, one for each critical feature. The percentage overdevelopment used during fabrication is that which yields suitable linewidths for both critical features. Additionally, for electron exposure where linewidth is broadened by the proximity effect (the effect of electrons scattering from the substrate) the prototypical plot should be for isolated features or features in densely packed portions of the pattern, whichever is the surroundings of the critical feature.

Figure 2:
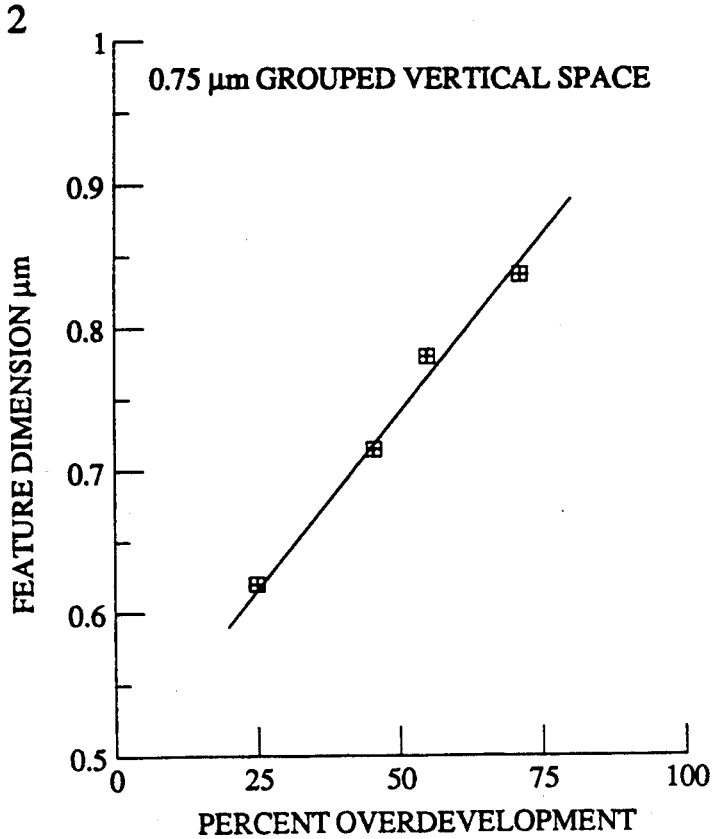

A significant additional benefit of the invention is that from the prototype plot(s), the size of all features in addition to the critical feature is determinable. For example, if in the prototype plot of FIG. 1 a 66% overdevelopment is employed to produce a 1.0 micron isolated critical feature then a feature desired to be a 0.75 μm space present in a periodic array from a corresponding prototype plot made for this critical feature size (as shown in FIG. 2) yields an actual feature size of 0.82 μm which is within acceptable tolerances. Thus, a series of prototype plots, based on the same dose, facilitates design of the pattern to obtain all critical dimensions and choice of an appropriate percent overdevelopment. This procedure thus allows modifications in pattern layout through simulation prior to the actual fabrication of the article.

The use of an optical monitoring procedure requires that the substrate be developed by a method that does not cause unacceptable inaccuracies in such monitoring. Thus for interferometric monitoring, use of a highly absorbing solvent for the light used is not desirable. For spray development as described by Thompson and Bowden in Introduction to Microlithography (Ed. L. F. Thompson, C. W. Wilson, M. J. Bowden, ACS Symposium Series 219, American Chemical Society, Washington D.C. 1983, P. 204), scattering of the light used for monitoring does occur. However, the noise introduced by such scattering into the signal is easily removed by conventional electronics including noise filtering and the signal is made identifiable through signal amplification.

Optical monitoring techniques are advantageously performed by introducing the monitoring light to the substrate using a wave guide such as an optical fiber. Light in the visible wave length spectrum is suitable. The spectrum of such light should not be overly broad, i.e., broader than 10 nm, or the interference fringes are not easily discernible. Detection means for the reflected light during the interference monitoring procedure include conventional photodiodes such as silicon photodiodes. It should be noted that interferometry requires a reflective substrate e.g., a substrate having a reflectivity greater than 10% or, signal degradation typically occurs. Additionally, for similar reasons, the surface should not induce excessive light scattering.

The following example is illustrative of the invention.

EXAMPLE

The development apparatus included a light source, fiber optic cable, photodiode detector, an electronic interface, and a modified Laserlith photoresist thickness monitor and end-point monitor system. The light source was an Oriel model 77501 broad band quartz halogen source powered by a built-in regulated DC power supply. The unit was equipped with a filter holder, and all measurements were obtained using a 450±10 nm narrow band pass filter. The filtered light was fed into one of the bifurcated legs of a randomized fiber optic cable. The fiber bundle was clad with an interlocked flexible stainless steel sheath coated with heat shrinkable teflon tubing. The cable was mounted atop an Applied Process Technology spray-spin resist processor with the common leg of the cable aimed perpendicular to the mask. A 11 mm lens mounted to the common end served as a collimator for light coming out of the cable as well as a collector for reflected light. The reflected light was fed through the other bifurcated leg to a United Detector Technology model 10DP photodiode mounted inside a light-tight enclosure. The signal from the photodiode was then amplified and filtered with a ±15 volt low pass electronic filtering module. The resultant signal was collected by a 16 bit AD interface card mounted in an AT&T 6312 microcomputer, which serves as a data analyzer as well as controller for the APT processor through the electronic interface unit.

Varying size (4"–6") and reflectivity chrome on glass plates and wafers (3"–4") were coated with 0.4 μm of a 4 wt./v % PBS solution supplied by Mead Technologies (Batch #'s MP-131, MP-107). Coated substrates were pre-exposure baked at 120° C. for 60 min in a forced-air convection oven.

Electron beam exposures at both 10 and 20 kV accelerating potentials were written on either a MEBES II or III system. Doses investigated at 10 and 20 kV ranged between 1.25 to 1.75 and 2.5 to 3.5 $\mu C/cm^2$, respectively. The beam address and spot size were 0.25 $\mu m$.

The exposed mask included an exposed centered process monitoring pad having an area ranging between 36 and 144 $mm^2$, and an array of linewidth control patterns around the pad. At each array position, a three-step exposure series was performed within the previously identified dose ranges. The dose applied to the middle position of each exposure series and the center pad were the same.

Spray-spin development of exposed substrates was carried out using a developer of compositions ranging between 70/30 to 90/10 v/v % 5-methyl-2-hexanone(-MIAK)/2-pentanone(MPK). All substrates were post-develop baked at 90° C. for a 30 min in air prior to development.

Isolated and grouped features in the range of 1.0 to 4.0 $\mu m$ were measured in reflected light using an ITP model 158 Mark IV linewidth measurement system. A minimum of six measurements around the development pad per feature size were taken. Statistical analysis determined the degree of agreement between target and actual feature sizes.

For a specific set of processing conditions, prototype plots were generated for isolated and grouped features. The penultimate extrema of the interferometric development trace from the exposed center pad was used as a time reference point for overdevelopment. The overdevelopment period was defined as the time of additional development after the time-reference point was reached. Curve fitting of the prototype data produced equations that are then used by the software to provide real-time control of feature size.

The prototype plot curve for an isolated vertical 1.5 $\mu m$ space was determined. One exposed plate was processed using the development time from the prototypical plot to obtain a 2.0 $\mu m$ vertical space in a grouped array, and a second plate to obtain a 1.5 $\mu m$ vertical isolated space. The actual linewidths obtained were 1.97±0.03 $\mu m$ for the coded 2 $\mu m$ space, and exactly 1.5±0.04 $\mu m$ for the coded 1.5 $\mu m$ isolated space. In both cases, the deviation from the coded size was within acceptable 0.05 $\mu m$ tolerance level.

I claim:

1. A process for fabricating an article, said process including an exposure with a dose of radiation of a radiation sensitive material in desired regions to form a latent pattern and development of said pattern through removal of said regions or of non-exposed regions by subjecting said region to a solvent for a development time and an overdevelopment time whereby a suitable dimension for critical features is obtained CHARACTERIZED in that said overdevelopment time is that established from data relating feature dimension to overdevelopment time wherein said data is obtained from a prototypical series of samples comprising exposure of said material with said dose for varying overdevelopment times to establish the overdevelopment time corresponding to a feature size and whereby said feature size is achievable without iterative development and without a strictly controlled environment.

2. The process of claim 1 wherein said radiation comprises electrons.

3. The process of claim 1 wherein said material comprises poly 1-butene sulfone.

4. The process of claim 1 wherein said article comprises a lithographic mask or an integrated circuit.

5. The process of claim 1 wherein said material is positive acting.

* * * * *